(12) United States Patent
Xie et al.

(10) Patent No.: US 11,537,179 B2
(45) Date of Patent: Dec. 27, 2022

(54) DISPLAY PANEL, FABRICATING METHOD THEREOF AND DISPLAY DEVICE

(71) Applicants: Beijing BOE Optoelectronics Technology Co., Ltd., Beijing (CN); BOE TECHNOLOGY GROUP CO., LTD., Beijing (CN)

(72) Inventors: Junjie Xie, Beijing (CN); Yezhou Tan, Beijing (CN); Zhenxing Luo, Beijing (CN); Bin Xiang, Beijing (CN); Jian Sang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/956,026

(22) PCT Filed: Oct. 22, 2019

(86) PCT No.: PCT/CN2019/112589
§ 371 (c)(1),
(2) Date: Jun. 19, 2020

(87) PCT Pub. No.: WO2020/143268
PCT Pub. Date: Jul. 16, 2020

(65) Prior Publication Data
US 2021/0223832 A1  Jul. 22, 2021

(30) Foreign Application Priority Data
Jan. 7, 2019  (CN) .......................... 201910013115.7

(51) Int. Cl.
*G06F 1/18* (2006.01)
*G09F 9/30* (2006.01)

(52) U.S. Cl.
CPC .............. *G06F 1/183* (2013.01); *G09F 9/301* (2013.01)

(58) Field of Classification Search
CPC ....................................................... G06F 1/163
See application file for complete search history.

(56) References Cited

U.S. PATENT DOCUMENTS

2007/0279852 A1* 12/2007 Daniel .................... G06F 1/163
361/679.03
2017/0285779 A1* 10/2017 Ryu ........................ G06F 3/041
2019/0129229 A1   5/2019 Cui et al.

FOREIGN PATENT DOCUMENTS

CN       105223747 A    1/2016
CN       107193166 A    9/2017
(Continued)

OTHER PUBLICATIONS

International Search Report and Written Opinion for International Application No. PCT/CN2019/112589 filed Jan. 10, 2020.

*Primary Examiner* — Jerry Wu
(74) *Attorney, Agent, or Firm* — Xsensus LLP

(57) ABSTRACT

A display panel includes an array substrate, a first flexible circuit board, a non-flexible circuit board, a control circuit board and a second flexible circuit board; the first flexible circuit board is electrically connected to the array substrate; the non-flexible circuit board is electrically connected to the first flexible circuit board; the control circuit board is provided on the non-flexible circuit board and is electrically connected with the non-flexible circuit board; the second flexible circuit board is electrically connected to the non-flexible circuit board.

8 Claims, 3 Drawing Sheets

(56) References Cited

FOREIGN PATENT DOCUMENTS

| CN | 107422553 | A | 12/2017 |
| CN | 107589579 | A | 1/2018 |
| CN | 107728365 | A | 2/2018 |
| CN | 108762562 | A | 11/2018 |
| CN | 105223747 | B | 4/2019 |
| CN | 109637368 | A | 4/2019 |
| CN | 209118667 | U | 7/2019 |
| JP | 2004077572 | A | 3/2004 |
| WO | 2019085016 | A1 | 5/2019 |

* cited by examiner

DISPLAY PANEL, FABRICATING METHOD THEREOF AND DISPLAY DEVICE

CROSS-REFERENCE TO RELATED APPLICATIONS

The present application is based upon and is a § 371 national phase application of PCT Patent Application No. PCT/CN2019/112589, filed on Oct. 22, 2019, which claims the benefit of and priority to Chinese Patent Application No. 201910013115.7, filed on Jan. 7, 2019, the contents of which being incorporated by reference in their entireties herein.

TECHNICAL FIELD

The present disclosure relates to the field of display technologies, and in particular, to a display panel, a fabricating method thereof, and a display device provided with the display panel.

BACKGROUND

In the display field, a high screen-to-body ratio of a display device is a development trend, and one direction of the trend is to use a display panel with narrow frame.

At present, the frame of the display device is wide, which makes it impossible to achieve a high screen-to-body ration. Although the frames of some display devices can be narrowed, the accuracy and yield are low due to the limitation of the fabricating process.

Therefore, it is necessary to research on a new display panel, a fabricating method thereof and a display device provided with the display panel.

The above information disclosed in the background section is only used to enhance the understanding of the background of the present disclosure, and therefore may include the information that does not constitute the prior art known to those of ordinary skill in the art.

SUMMARY

According to an aspect of the present disclosure, there is provided a display panel including:
an array substrate;
a first flexible circuit board, electrically connected to the array substrate;
a non-flexible circuit board, electrically connected to the first flexible circuit board;
a control circuit board, provided on the non-flexible circuit board and electrically connected with the non-flexible circuit board; and
a second flexible circuit board electrically connected to the non-flexible circuit board.

In an exemplary embodiment of the present disclosure, the non-flexible circuit board is a printed circuit board.

In an exemplary embodiment of the present disclosure, a difference between a thermal expansion coefficient of the control circuit board and a thermal expansion coefficient of the non-flexible circuit board is smaller than a preset threshold.

In an exemplary embodiment of the present disclosure, the preset threshold is 40% of the thermal expansion coefficient of the control circuit board.

In an exemplary embodiment of the present disclosure, the first flexible circuit board is provided between the array substrate and the non-flexible circuit board to realize the array substrate is electrically connected with the non-flexible circuit board and the first flexible circuit board and is configured to bend when the display panel is packaged.

In an exemplary embodiment of the present disclosure, there is a set distance between the array substrate and the non-flexible circuit board to provide a bending space for the first flexible circuit board.

In an exemplary embodiment of the present disclosure, the display panel further includes:
a first anisotropic conductive film provided between the array substrate and the first flexible circuit board.

In an exemplary embodiment of the present disclosure, the display panel further includes:
a second anisotropic conductive film provided between the first flexible circuit board and the non-flexible circuit board.

In an exemplary embodiment of the present disclosure, the display panel further includes:
a third anisotropic conductive film provided between the control circuit board and the non-flexible circuit board.

In an exemplary embodiment of the present disclosure, the display panel further includes:
a fourth anisotropic conductive film provided between the non-flexible circuit board and the second flexible circuit board.

In an exemplary embodiment of the present disclosure, a first connection portion of the first flexible circuit board is adhered on the array substrate.

In an exemplary embodiment of the present disclosure, a second connection portion of the first flexible circuit board is adhered on the non-flexible circuit board.

In an exemplary embodiment of the present disclosure, a connection portion of the second flexible circuit board is adhered on the non-flexible circuit board.

In an exemplary embodiment of the present disclosure, the display panel further includes:
a connector electrically connected to the second flexible circuit board.

According to an aspect of the present disclosure, there is provided a display device, including:
a display panel of any display panels as described above.

According to an aspect of the present disclosure, there is provided a method for fabricating a display panel, including:
providing an array substrate;
providing a first flexible circuit board so that the first flexible circuit board is electrically connected to the array substrate;
providing a non-flexible circuit board so that the non-flexible circuit board is electrically connected to the first flexible circuit board;
providing a control circuit board so that the control circuit board is electrically connected to the non-flexible circuit board; and
providing a second flexible circuit board so that the second flexible circuit board is electrically connected to the non-flexible circuit board.

BRIEF DESCRIPTION OF THE DRAWINGS

The above and other features and advantages of the present disclosure will become more apparent by describing its exemplary embodiments in detail with reference to the accompanying drawings.

DETAILED DESCRIPTION

Figure 1:
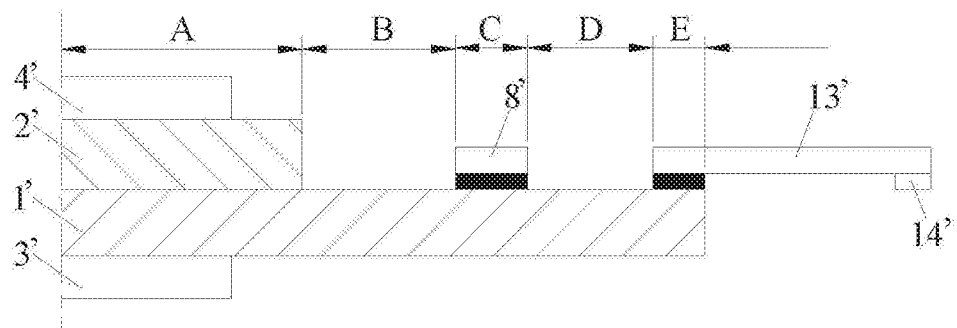
FIG. 1 is a structural schematic diagram of a display panel of one embodiment in the related art.

Exemplary embodiments will now be described more fully with reference to the accompanying drawings. However, exemplary embodiments can be implemented in various forms and should not be construed as limited to the embodiments set forth herein; rather, these embodiments are provided so that the present disclosure will be thorough and complete, and will fully convey the concept of exemplary embodiments to those skilled in the art. The same reference numerals in the drawings denote the same or similar structures, and thus detailed descriptions thereof will be omitted.

Figure 2:
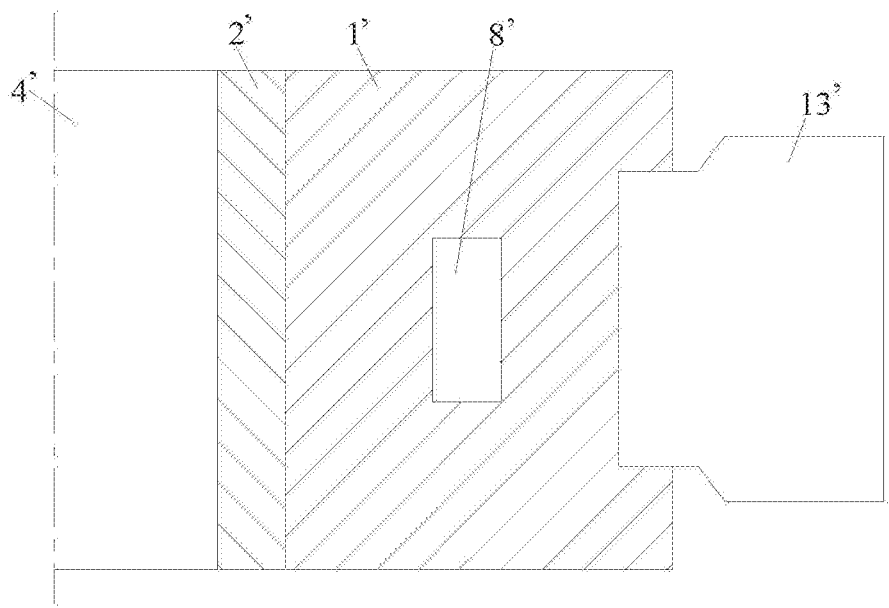
FIG. 2 is a schematic top view of FIG. 1.

Referring to the structural schematic diagram of the display panel of one embodiment in the related art shown in FIG. 1 and FIG. 2, the dotted lines in these figures are dividing lines between the display region and the frame region; the display panel includes an array substrate 1', a color filter substrate 2' provided on the array substrate 1', a first polarizer sheet 3' disposed below the array substrate 1', a second polarizer sheet 4' disposed on the color filter substrate 2', a control circuit board 8' provided on the array substrate 1' and connected with the array substrate 1', and a flexible circuit board 13' connected with the array substrate 1', where the flexible circuit board 13' is a main flexible circuit board. The flexible circuit board 13' can be bent during the packaging without affecting the frame width of the display panel. A connector 14' is disposed on the flexible circuit board 13'. The frame width on the terminal side of the display panel (the width from the display region of the display panel to the outermost edge of the display panel) is constituted by adding the five dimensions A, B, C, D and E, where the dimension A is a dimension of the distance from the display region to the outermost edge of the color filter substrate 2', the dimension B is a dimension of the distance from the outermost edge of the color filter substrate 2' to the control circuit board 8', the dimension C is the width of the control circuit board 8', the dimension D is the a dimension of the distance from the control circuit board 8' to the flexible circuit board 13', and the dimension E is the width of the portion of the flexible circuit board 13' adhered on the array substrate 1' of the display panel. According to the current process limit, the width of the frame is ≥3.7 mm. It can be understood from FIG. 1 that the frame width of the display panel is the width of the portion of the array substrate 1' protruded out of the display region, and both the control circuit board 8' and the flexible circuit board 13' need to be connected to the array substrate 1', therefore, the display panel cannot realize an ultra-narrow frame design and thus a higher screen-to-body ratio.

Figure 3:
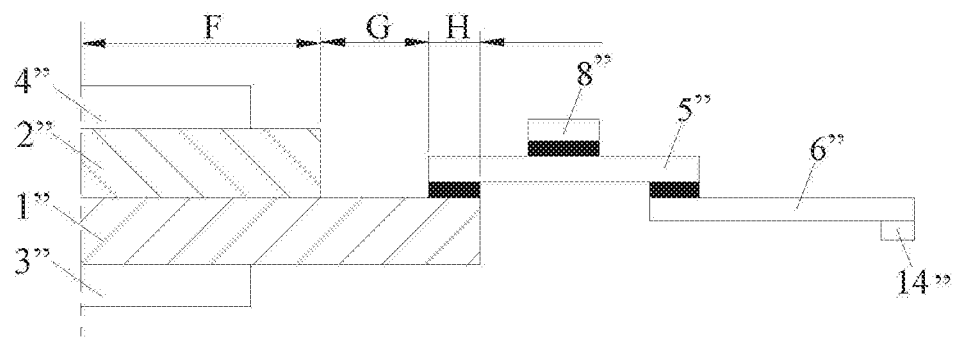
FIG. 3 is a structural schematic diagram of a display panel of another embodiment in the related art.
Figure 4:
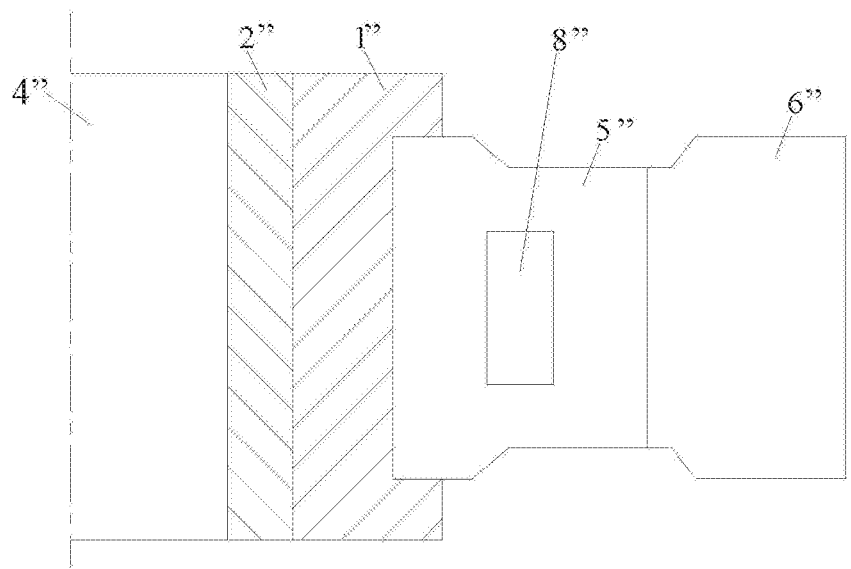
FIG. 4 is a schematic top schematic view of FIG. 3.

FIG. 3 and FIG. 4 are structural schematic diagrams of the display panel another embodiment of in the related art, in which dotted lines are dividing lines between the display region and the frame region; the display panel includes an array substrate 1", a color filter substrate 2" provided on the array substrate 1", a first polarizer sheet 3" disposed below the array substrate 1", a second polarizer sheet 4" disposed on the color filter substrate 2", a first flexible circuit board 5" provided on the array substrate 1" and connected with the array substrate 1", a control circuit board 8" provided on the first flexible circuit board 5", and a second flexible circuit board 6" connected with the first flexible circuit board 5", and the second flexible circuit board 6" is a main flexible circuit board. A connector 14" is disposed on the second flexible circuit board 6". The first flexible circuit board 5" and the second flexible circuit board 6" can be bent during the packaging without affecting the frame width of the display panel. The frame width on the terminal side of the display panel (the width from the display region of the display panel to the outermost edge of the display panel) constituted by adding the three dimensions F, G, and H, where the dimension F is a dimension of the distance from the display region to the outermost edge of the color filter substrate 2", the dimension G is a dimension of the distance from the outermost edge of the color filter substrate 2" to the first flexible circuit board 5", and the dimension H is the width of the portion of the first flexible circuit board 5" adhered on the array substrate 1" of the display panel. Compared with the embodiment in FIG. 1, the width of the control circuit board 8" and the dimension of the distance of the control circuit board 8" from the flexible circuit board are saved. The frame width can be reduced by about 1.5 mm, so that a narrow frame design and thus a higher screen-to-body ratio can be realized. However, the control circuit board 8" and the first flexible circuit board 5" need to be continuously heated to 400° C. during their roll-to-roll adhesion production process, and the thermal expansion coefficient of the first flexible circuit board 5" is about 16 um/m/° C., while the thermal expansion coefficient of the control circuit board 8" is about 2.49 um/m/° C. As the difference between the two is large, it is unstable after the adhesion process, the manufacturing yield is low, and the precision requirement on the adhesion machine is high. Moreover, the first flexible circuit board 5" and the second flexible circuit board 6" are soft-to-soft attaching, and the attaching precision is not easy to control, and the requirement to the equipment precision is very high, therefore, the existing equipment cannot meet this process requirement, and the equipment investment cost needs to be increased.

Figure 5:
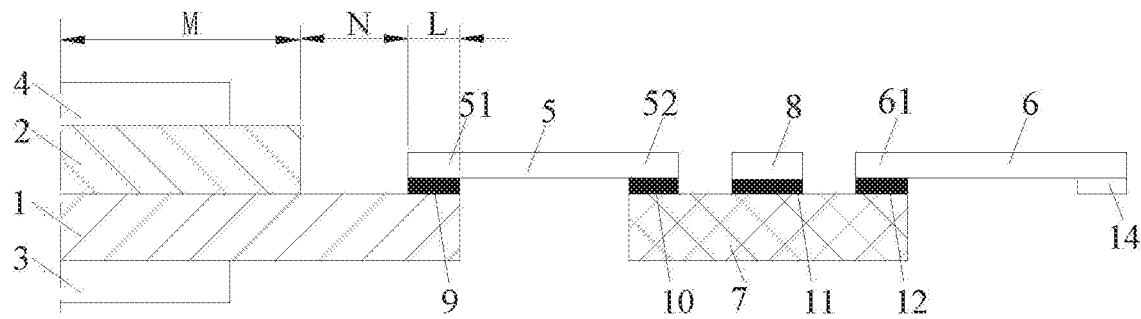
FIG. 5 is a structural schematic diagram of a display panel of one embodiment of the present disclosure.
Figure 6:
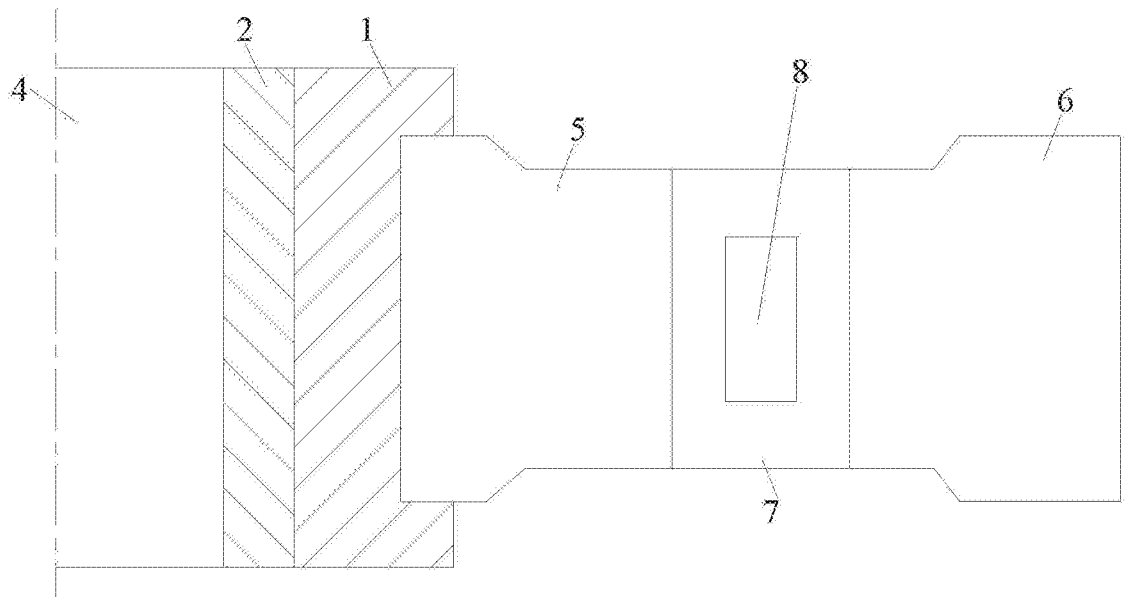
FIG. 6 is a schematic top view of FIG. 5.

First, the present disclosure provides a display panel. Referring to the structural schematic diagrams of a display panel in one embodiment of the present disclosure shown in FIG. 5 and FIG. 6, dotted lines are dividing lines between the display region and the frame region. The display panel may include an array substrate 1, a first flexible circuit board 5, a non-flexible circuit board 7, a control circuit board 8, and a second flexible circuit board 6. The first flexible circuit board 5 is electrically connected to the array substrate 1; the non-flexible circuit board 7 is electrically connected to the first flexible circuit board 5; the control circuit board 8 is provided on the non-flexible circuit board 7 and is electrically connected with the non-flexible circuit board 7 where the control circuit board 8 may be a driver integrated circuit (Driver IC); and the second flexible circuit board 6 is electrically connected to the non-flexible circuit board 7.

In the exemplary embodiment, a color filter substrate 2 is disposed on the array substrate 1, and a first polarizer sheet 3 is disposed below the array substrate 1; a second polarizer sheet 4 is disposed on the color filter substrate 2. On the terminal side of the display panel, one side of the array substrate 1 is protruded from the color filter substrate 2, and the first flexible circuit board 5 is provided at an end of the array substrate 1 that is protruded from the color filter substrate 2.

In the exemplary embodiment, a first connection portion 51 and a second connection portion 52 are disposed on the first flexible circuit board 5, the first connection portion 51 and the second connection portion 52 are both disposed on the lower surface of the first flexible circuit board 5, and the first connection portion 51 and the second connection portion 52 are located at the opposite end portions of the first flexible circuit board 5. The first connection portion 51 of the first flexible circuit board 5 is adhered to the upper surface of the array substrate 1 through a first anisotropic conductive film 9. The second connection portion 52 of the first flexible printed circuit board 5 is adhered to the upper surface of the non-flexible circuit board 7 through a second anisotropic conductive film 10. The first flexible circuit board 5 can be bent during the packaging, there is a set distance between the array substrate 1 and the non-flexible circuit board 7, and the set distance is sufficient to ensure that the first flexible circuit board 5 can be bent. In other exemplary embodiments of the present disclosure, the first connection portion 51 and the second connection portion 52 may be disposed on the upper surface of the first flexible circuit board 5, respectively, so that the first flexible circuit board 5 is connected with the lower surfaces of the array substrate 1 and the non-flexible circuit board 7.

In the exemplary embodiment, the lower surface of the control circuit board 8 is adhered to the upper surface of the non-flexible circuit board 7 through a third anisotropic conductive film 11. The control circuit board 8 is a printed circuit board. In other exemplary embodiments of the present disclosure, the upper surface of the control circuit board 8 may be adhered to the lower surface of the non-flexible circuit board 7 through the third anisotropic conductive film 11. The non-flexible circuit board 7 may be a printed circuit board which is made of hard materials.

In the exemplary embodiment, the frame width on the terminal side of the display panel (the width from the display region of the display panel to the outermost edge of the display panel) is constituted by adding the three dimensions M, N and L, where the dimension M is a dimension of the distance from the display region to the outermost edge of the color filter substrate 2, the dimension N is a dimension of the distance from the outermost edge of the color filter substrate 2 to the first flexible circuit board 5, and the dimension L is the width of the portion of the first flexible circuit board 5 adhered on the array substrate 1 of the display panel. The array substrate 1 is connected with the first flexible circuit board 5, the first flexible circuit board 5 can be bent during the packaging, and the control circuit board 8 is not disposed on the array substrate 1, so that the width of the array substrate 1 can be reduced, that is to say, a narrow frame can be realized.

In the exemplary embodiment, a connection portion 61 is also disposed on the second flexible circuit board 6, the connecting portion is located on the lower surface of the second flexible circuit board 6, the connection portion 61 of the second flexible circuit board 6 is adhered to the upper surface of the non-flexible circuit board 7 through a fourth anisotropic conductive film 12, and the second flexible circuit board 6 is located at an end of the non-flexible circuit board 7 away from the first flexible circuit board 5. The connection portion 61 is located at an end of the second flexible circuit board 6 close to the non-flexible circuit board 7. The second flexible circuit board 6 is a main flexible circuit board, a connector 14 is disposed on the second flexible circuit board 6, and the second flexible circuit board can be connected with an external signal source through the connector 14, so that the external input signal can realize circuit control on the display panel. The connector 14 may be a snap-fit connector, and it may in turn be connected to an external device by means of a snap-fit; a plug-in connector can also be adopted, and it may in turn be connected to an external device by means of plug-in; this is not particularly limited in the exemplary embodiment. The first flexible circuit board 5 and the second flexible circuit board 6 are connected through the non-flexible circuit board 7, so that soft-to-soft attaching is avoided, and attaching precision is improved, and the requirement to the equipment precision is not high, the existing equipment can meet this process requirement, and there is no need to increase the equipment investment cost. The control circuit board 8 is provided on the non-flexible circuit board 7, and the difference between the thermal expansion coefficients of the control circuit board 8 and the non-flexible circuit board 7 is small, the thermal expansion coefficient of the control circuit board is about 2.49 um/m/° C., the non-flexible circuit board 7 is generally made of glass of 3-3.5 um/m/° C., the difference between the thermal expansion coefficients of the control circuit board and the non-flexible circuit board is smaller than a preset threshold, the preset threshold is 40% of the thermal expansion coefficient of the control circuit board, so that instability and low manufacturing yield caused by large difference between the thermal expansion coefficients are avoided.

In the display panel of the present disclosure, the array substrate is connected with the non-flexible circuit board through the first flexible circuit board, the first flexible circuit board is connected with the second flexible circuit board through the non-flexible circuit board, and the control circuit board is provided on the non-flexible circuit board. On one hand, the array substrate is connected with the first flexible circuit board, the first flexible circuit board can be bent during the packaging, and the control circuit board is not provided on the array substrate, so that the width of the array substrate can be reduced, and narrow frame can be realized; on the other hand, the first flexible circuit board and the second flexible circuit board are connected through the non-flexible circuit board, so that soft-to-soft attaching is avoided, and attaching precision is improved; still on the other hand, the control circuit board is provided on the non-flexible circuit board, so that instability and low manufacturing yield caused by the large difference in thermal expansion coefficients are avoided.

Figure 7:
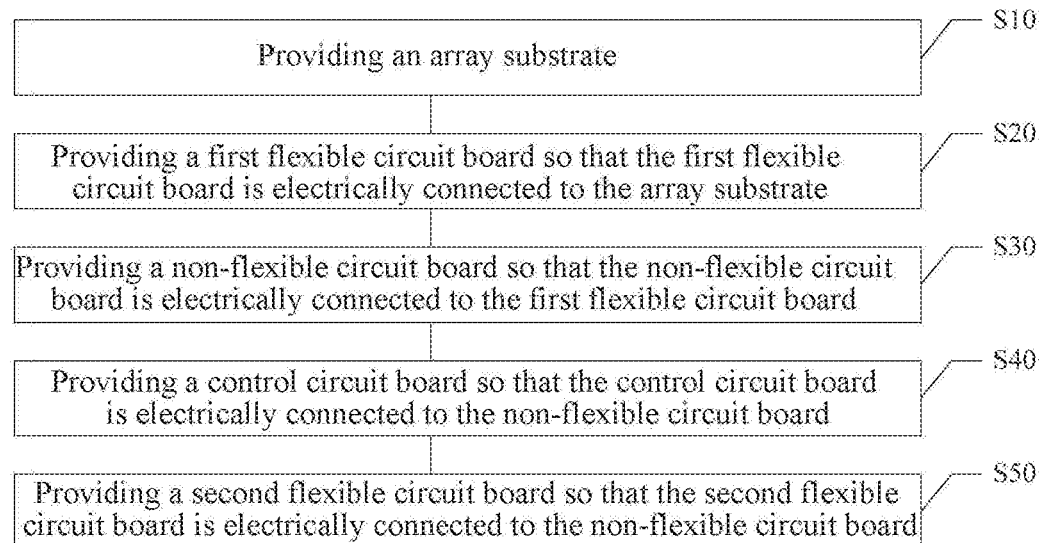
FIG. 7 is a schematic flow diagram of a method for fabricating the display panel of one embodiment of the present disclosure.

Further, the present disclosure also provides a method for fabricating the display panel, which refers to a flow diagram of the method for fabricating the display panel of the present disclosure shown in FIG. 7; the fabricating method can include the following steps:

Step S10, providing an array substrate 1.

Step S20, providing a first flexible circuit board 5 so that the first flexible circuit board 5 is electrically connected to the array substrate 1.

Step S30, providing a non-flexible circuit board 7 so that the non-flexible circuit board 7 is electrically connected to the first flexible circuit board 5.

Step S40, providing a control circuit board 8 so that the control circuit board 8 is electrically connected to the non-flexible circuit board 7.

Step S50, providing a second flexible circuit board 6 so that the second flexible circuit board 6 is electrically connected to the non-flexible circuit board 7.

In the exemplary embodiment, first, the array substrate 1 and the non-flexible circuit board 7 are provided to maintain a set distance between the array substrate 1 and the non-flexible circuit board 7, and the first flexible circuit board 5 is adhered between the array substrate 1 and the non-flexible circuit board 7 through an anisotropic conductive adhesive under heating and pressing conditions. Then, the control circuit board 8 is adhered on the non-flexible circuit board 7 through an anisotropic conductive adhesive under heating and pressing conditions. Finally, the second flexible circuit board 6 is adhered on the non-flexible circuit board 7 through an anisotropic conductive adhesive under heating and pressing conditions. In other exemplary embodiments of the present disclosure, the first connection portion 51 of the first flexible circuit board 5 may also be firstly adhered on the array substrate 1, and then the second connection portion 52 of the first flexible circuit board 5 may be adhered to the non-flexible circuit board 7; then, the control circuit board 8 is adhered on the non-flexible circuit board 7; finally, the second flexible circuit board 6 is adhered on the non-flexible circuit board 7. The first flexible circuit board 5 may also be adhered to the array substrate 1 after the adhesion of the first flexible circuit board 5, the non-flexible circuit board 7, the control circuit board 8 and the second flexible circuit board 6 is completed.

Further, the present disclosure also provides a display device, which includes the display panel described above. The specific structure of the display panel has been described in detail above, so it will not be repeated here.

The features, structures or characteristics described above may be combined in any suitable manner in one or more embodiments, and the features discussed in the various embodiments are interchangeable if possible. In the above description, numerous specific details are provided to give a thorough understanding of embodiments of the present disclosure. However, those skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring various aspects of the present disclosure.

The phrase "about" or "approximately" as used in the specification generally means within 20%, preferably within 10%, and more preferably within 5% of a given value or range. The quantities given here are approximate quantities, meaning that the meaning of "about", "approximately" and "probably" may be implied, unless otherwise specified.

Although the relative terms such as "upper" and "lower" are used in the specification to describe the relative relationship of one component of the icon to another component, these terms are used in the specification for convenience only, for example, the direction of the example described according to the accompanying drawing. It can be understood that if the device of the icon is flipped upside down, the component described "above" will become the component "below". Other relative terms such as "high", "low", "top", and "bottom" also have similar meanings. When a structure is "on" another structure, it may mean that a structure is integrally formed on another structure, or that a structure is "directly" disposed on another structure, or that a structure is "indirectly" disposed through another structure.

In the specification, the terms "a", "an", "the", and "said" are used to mean the presence of one or more elements/components, etc.; the terms "comprising", "including" and "having" are used to represent the meaning of openness and means that there may be additional elements/components/etc. in addition to the listed elements/components/etc.; the terms "first", "second" and "third", etc. are used only as marks, not a limit on the number of objects.

It should be understood that the present disclosure does not limit its application to the detailed structure and arrangement of the components as set forth in the specification. The present disclosure is capable of having other embodiments and of being practiced and carried out in various ways. The foregoing variations and modifications are intended to fall within the scope of the present disclosure. It should be understood that the present disclosure disclosed and defined herein extends to all alternative combinations of two or more individual features that are mentioned or apparent in the specification and/or drawings. All of these different combinations constitute a number of alternative aspects of the present disclosure. The embodiments described in the specification are illustrative of the best mode of the present disclosure, and will enable those skilled in the art to utilize the present disclosure.

What is claimed is:

1. A display panel, comprising: an array substrate; a color filter substrate disposed on an upper surface of the array substrate; a first flexible circuit board electrically connected to the upper surface of the array substrate, wherein the first flexible circuit board is provided at an end of the array substrate protruded from the color filter substrate, a lower surface of the first flexible circuit board has a first connection portion and a second connection portion located on opposite edges of the first flexible circuit, and the first connection portion of the first flexible circuit board is adhered to the upper surface of the array substrate through a first anisotropic conductive film; a non-flexible circuit board electrically connected to the first flexible circuit board, wherein the second connection portion of the first flexible circuit board is adhered to an upper surface of an edge of the non-flexible circuit board through a second anisotropic conductive film; a control circuit board on the non-flexible circuit board and electrically connected with the non-flexible circuit board, wherein a lower surface of the control circuit board is adhered to the upper surface of the non-flexible circuit board through a third anisotropic conductive film; and a second flexible circuit board electrically connected to the non-flexible circuit board, wherein the second flexible circuit board has a first connection portion and a second connection portion located on opposite edges of a lower surface of the second flexible circuit board, the first connection portion of the second flexible circuit board is adhered on the upper surface of the non-flexible circuit board through a fourth anisotropic conductive film, the second flexible circuit board is located at an end of the non-flexible circuit board away from the first flexible circuit board, the first flexible circuit board and the second flexible circuit board are elements separated from each other, and the first flexible circuit board and the second flexible circuit board are elements without direct connection to each other; and the display panel comprises: a snap-fit connector electrically connected to the second flexible circuit board to make the second flexible circuit board connected with an external signal source through the second connector, so that an external input signal can realize circuit control on the display panel; and a set distance between the array substrate and the non-flexible circuit board to provide a bending space for the first flexible circuit board.

2. The display panel according to claim 1, wherein the non-flexible circuit board is a printed circuit board.

3. The display panel according to claim 2, wherein a difference between a thermal expansion coefficient of the control circuit board and a thermal expansion coefficient of the non-flexible circuit board is smaller than a preset threshold.

4. The display panel according to claim 1, wherein a difference between a thermal expansion coefficient of the control circuit board and a thermal expansion coefficient of the non-flexible circuit board is smaller than a preset threshold.

5. The display panel according to claim 4, wherein the preset threshold is 40% of the thermal expansion coefficient of the control circuit board.

6. The display panel according to claim 4, wherein the first flexible circuit board is provided between the array substrate and the non-flexible circuit board to realize the array substrate is electrically connected with the non-flexible circuit board and the first flexible circuit board is configured to bend when the display panel is packaged.

7. The display panel according to claim 1, wherein the first flexible circuit board is provided between the array substrate and the non-flexible circuit board to realize the array substrate being electrically connected with the non-flexible circuit board, and the first flexible circuit board is configured to bend when the display panel is packaged.

8. The display panel according to claim 1, wherein there is a set distance between the array substrate and the non-flexible circuit board to provide a bending space for the first flexible circuit board.

* * * * *